United States Patent
Taguchi et al.

(10) Patent No.: US 6,465,964 B1
(45) Date of Patent: Oct. 15, 2002

(54) PLASMA TREATMENT APPARATUS AND PLASMA GENERATION METHOD USING THE APPARATUS

(75) Inventors: Noriyuki Taguchi, Otsu; Yasushi Sawada, Neyagawa; Keiichi Yamazaki, Nara; Yoshiyuki Nakazono, Kadoma; Yukiko Inooka; Kazuya Kitayama, both of Moriguchi, all of (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/694,324

(22) Filed: Oct. 24, 2000

(30) Foreign Application Priority Data

Oct. 25, 1999 (JP) ............................................ 11-303115

(51) Int. Cl.⁷ ................................................. H01J 7/24
(52) U.S. Cl. ............................. 315/111.21; 315/111.71; 118/723 E
(58) Field of Search ........................ 315/111.21, 111.41, 315/111.51, 111.71, 111.91; 118/723 E, 723 ER; 313/231.31

(56) References Cited

U.S. PATENT DOCUMENTS

| | | | | |
|---|---|---|---|---|
| 4,452,686 A | * | 6/1984 | Axenov et al. | ............. 204/298 |
| 4,785,220 A | * | 11/1988 | Brown et al. | ........... 315/111.91 |
| 5,198,724 A | | 3/1993 | Koinuma et al. | ....... 315/111.21 |
| 5,680,014 A | * | 10/1997 | Miyamoto et al. | ...... 315/111.41 |
| 5,789,867 A | * | 8/1998 | Westendorp et al. | .... 315/111.21 |
| 6,084,198 A | * | 7/2000 | Birx | ....................... 219/121.48 |

FOREIGN PATENT DOCUMENTS

| | | | | |
|---|---|---|---|---|
| JP | 1-306569 | 12/1989 | ............ | C23C/16/50 |
| JP | 2-15171 | 1/1990 | ............ | C23C/16/30 |
| JP | 3-219082 | 9/1991 | ............ | C23C/16/50 |
| JP | 3-241739 | 10/1991 | ......... | H01L/21/302 |
| JP | 4-212253 | 8/1992 | ............ | H05H/1/24 |
| JP | 4-358076 | 12/1992 | ............ | C23C/16/50 |
| JP | 6-108257 | 4/1994 | ............ | C23C/16/50 |
| JP | 11-260597 | 9/1999 | ............ | H05H/1/52 |

* cited by examiner

*Primary Examiner*—Don Wong
*Assistant Examiner*—Jimmy T. Vu
(74) *Attorney, Agent, or Firm*—Oblon, Spivak, McClelland, Maier & Neustadt, P.C.

(57) ABSTRACT

A plasma treatment apparatus can generate atmospheric pressure plasma with reliability by help of an ignition electrode to facilitate starting the apparatus without using an expensive impedance matching device. The apparatus comprises a plasma-generation chamber having an aperture from which the plasma blows out, a gas supply unit for supplying a gas for plasma generation into the chamber, a pair of electrodes, a power source for applying an AC electric field between the electrodes to maintain the plasma in the chamber, a pulse generator for providing a pulse voltage, and the ignition electrode for applying the pulse voltage to the gas supplied in the chamber to generate the plasma.

9 Claims, 8 Drawing Sheets

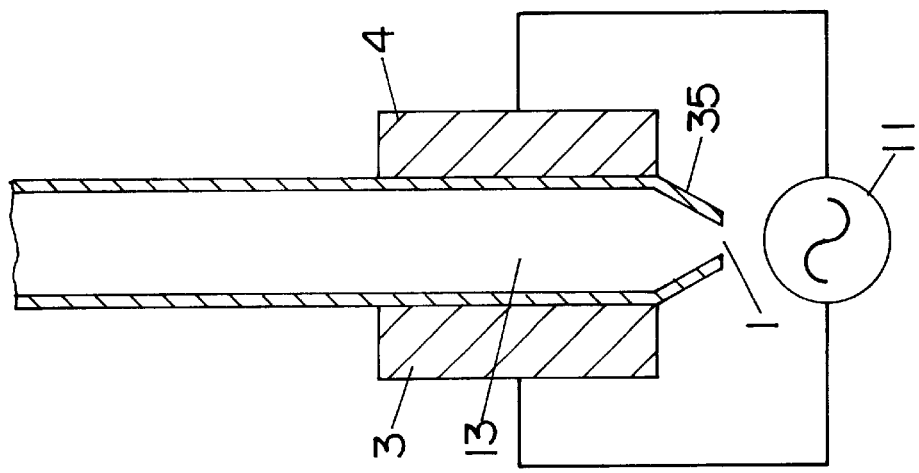
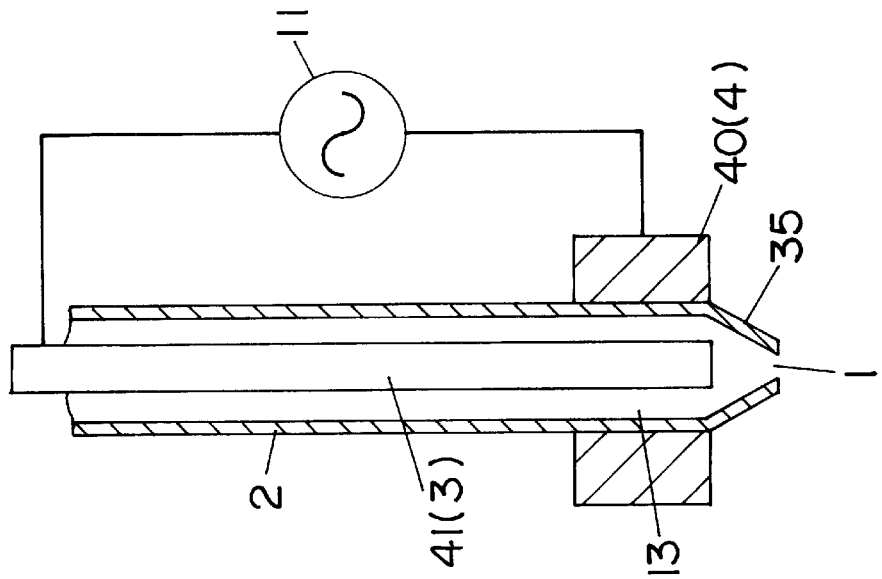

PLASMA TREATMENT APPARATUS AND PLASMA GENERATION METHOD USING THE APPARATUS

BACKGROUND OF THE INVENTION

1. Field of the Invention

The present invention relates to a plasma treatment apparatus for treating objects with atmospheric pressure plasma, and a plasma generation method using the apparatus.

2. Disclosure of the Prior Art

In the past, various surface treatments are performed by use of atmospheric pressure plasma. For example, it is disclosed in each of Japanese Patent Early Publications [KOKAI] 2-15171, 3-241739 and 1-306569 that a plasma treatment is performed by a plasma treatment device comprising a pair of electrodes and a dielectric material disposed therebetween in a reaction chamber. In these methods, a plasma-generation gas containing a rare gas such as helium or argon as the main component is supplied into the chamber, and objects are treated with plasma generated by applying an AC electric field between the electrodes.

In addition, Japanese Patent Early Publications [KOKAI] 4-358076, 3-219082, 4-212253, 6-108257 and 11-260597 disclose about plasma treatment devices each using a plasma jet generated under a pressure in the vicinity of atmospheric pressure. For example, as shown in FIG. 8, a typical plasma treatment device of the prior art comprises a reaction tube 2P, gas supply unit 8P, a pair of first and second electrodes 3P, 4P disposed around the reaction tube, and an AC power source 11P connected to the first electrode 3P through an impedance-matching unit 12P. The second electrode 4P is grounded.

The reaction tube 2P is formed with a gas inlet 10P at its top opening and a plasma blowoff nozzle 1P at its bottom opening. The numeral 12P designates an impedance-matching unit 12P having a variable capacitor 14P and an inductor (not shown), which is used to obtain the impedance matching between the power source 11P and a plasma generation region 13P in the reaction tube 2P between the first and second electrodes 3P, 4P.

By using the above-described apparatus, a plasma treatment is performed as follows. First, the plasma-generation gas is supplied into the reaction tube 2P from the gas supply unit 8P through the gas inlet 10P, and then an AC electric field is applied between the first and second electrodes 3P, 4P to generate atmospheric pressure plasma in the reaction tube. The objects are treated by a jet-like plasma injected from the reaction tube 2P through the blowoff nozzle 1P.

In this plasma treatment, since the atmospheric pressure plasma is used, it is needed to apply a high voltage of more than 1 kV to the first electrode 3P for plasma generation. In addition, when the electrodes 3P, 4P are disposed outside of the reaction tube 2P, as shown in FIG. 8, most of the applied AC electric field is released into the surrounding space other than the interior of the reaction tube, so that a magnitude increase in discharge initiation voltage is required. Moreover, since a typical frequency of the AC electric field is 13.56 MHz, it is required to obtain the impedance matching between the power source 11P and the plasma generation region 13P.

Therefore, when such a high voltage is applied to the first electrode 3P to generate the atmospheric pressure plasma in the reaction tube 2P, arc discharge may occur in the variable capacitor 14P such as a conventional air capacitor of the impedance matching unit 12P. In this case, there is an inconvenience that the plasma can not be generated in the reaction tube and a malfunction of the plasma treatment apparatus is caused thereby. To solve this problem, it is proposed to use an expensive impedance matching unit with a vacuum capacitor having a high withstand voltage. However, there is another problem that the cost performance of the apparatus deteriorates.

SUMMARY OF THE INVENTION

In view of the above points, a primary object of the present invention is to provide a plasma treatment apparatus characterized in that plasma can be generated under a pressure in the vicinity of atmospheric pressure with reliability by help an ignition electrode to facilitate starting the apparatus without using an expensive impedance matching device. That is, the plasma treatment apparatus of the present invention comprises a plasma-generation chamber having an aperture from which the plasma blows out, a gas supply for supplying a gas for plasma generation into the chamber, a pair of electrodes, a power source for applying an AC electric field between the electrodes to maintain the plasma in the chamber, a pulse generator for providing a pulse voltage, and an ignition electrode for applying the pulse voltage to the gas supplied in the chamber to generate the plasma.

It is preferred that the pair of electrodes make contact with an outer surface of the chamber. In this case, since these electrodes are not exposed to the plasma, it is possible to prevent contamination of the plasma with the electrode substance.

It is also preferred that the ignition electrode is disposed in the vicinity of the aperture.

In a preferred embodiment of the present invention, the plasma treatment apparatus comprises an electrode traveling unit for traveling the ignition electrode between a first position where the ignition electrode is disposed in the vicinity of the aperture to apply the pulse voltage to the gas and a second position where the ignition electrode is spaced from the aperture. In this case, since the ignition electrode can be transferred from the first position to the second position after the plasma is generated, there is an advantage that the ignition electrode is out of the way of the plasma treatment.

It is preferred that the ignition electrode is disposed outside of the chamber and adjacent to a discharge region provided in the chamber by the pair of electrodes. In this case, since the ignition is not exposed to the plasma, it is possible to prevent contamination of the plasma with the electrode substance. It is also preferred that the ignition electrode makes contact with an outer surface of the chamber.

In a further preferred embodiment of the present invention, an inside dimension of the aperture is within a range of 1 mm to 20 mm. In this case, it is possible to improve the efficiency of the plasma treatment.

Another object of the present invention is to provide a plasma generation method using the plasma treatment apparatus described above comprising the step of applying a pulse voltage to a gas for plasma generation under a pressure in the vicinity of atmospheric pressure by use of the ignition electrode to generate plasma in the chamber.

In the plasma generation method, when a magnitude of the pulse voltage provided by the pulse generator is three times or more of a voltage value applied between the pair of electrodes, it is possible to stably generate the atmospheric pressure plasma.

These and still other objects and advantages will become apparent from the following detail description of the invention and examples of the invention.

BRIEF EXPLANATION OF THE DRAWINGS

FIGS. 7A and 7B are schematic cross-sectional views showing modifications of electrode arrangements.

DETAIL DESCRIPTION OF THE INVENTION

The present invention is explained in detail according to preferred embodiments, referring to the attached drawings.

Figure 1:
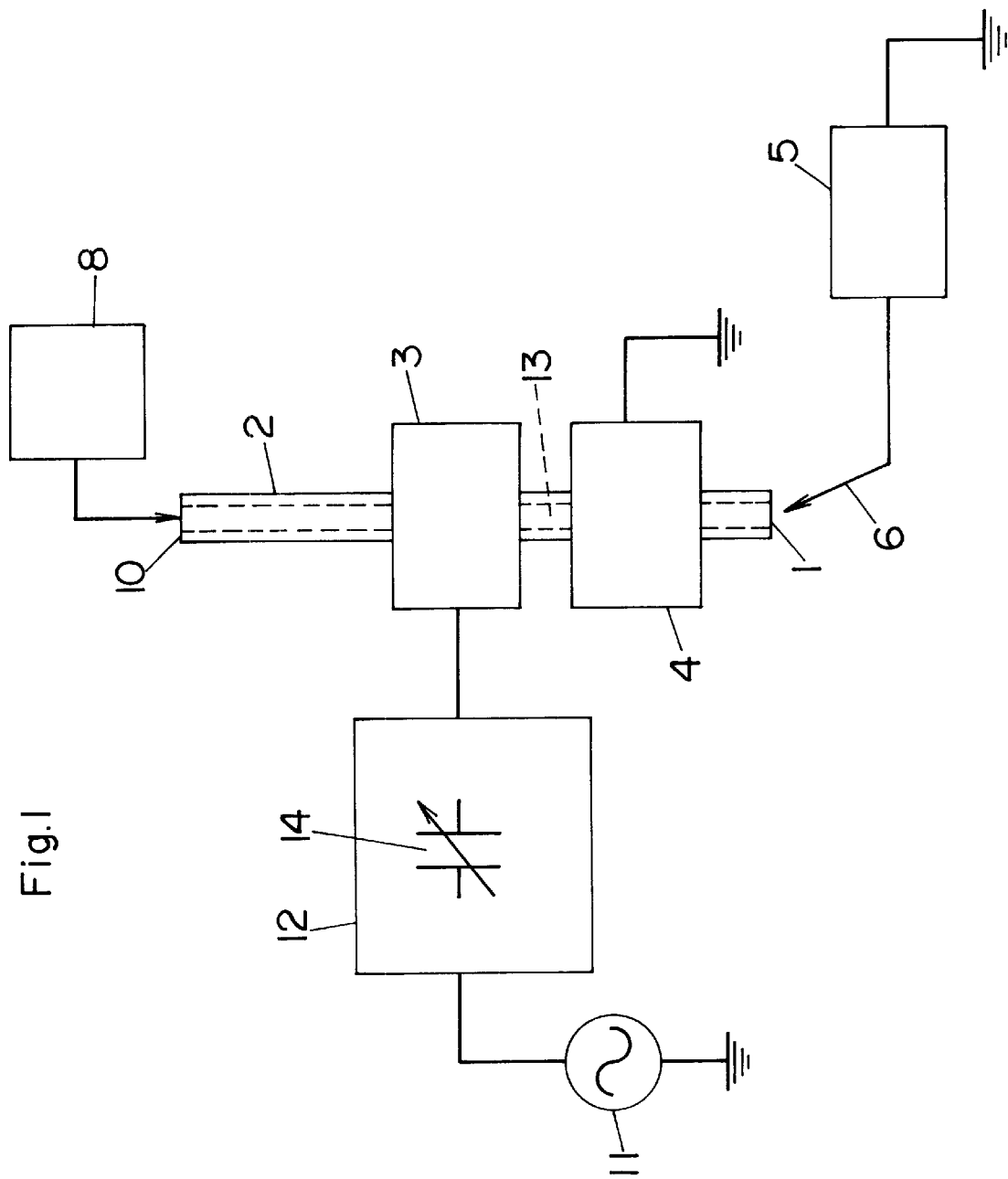
FIG. 1 is a schematic view of a plasma treatment apparatus according to a preferred embodiment of the present invention.
Figure 2:
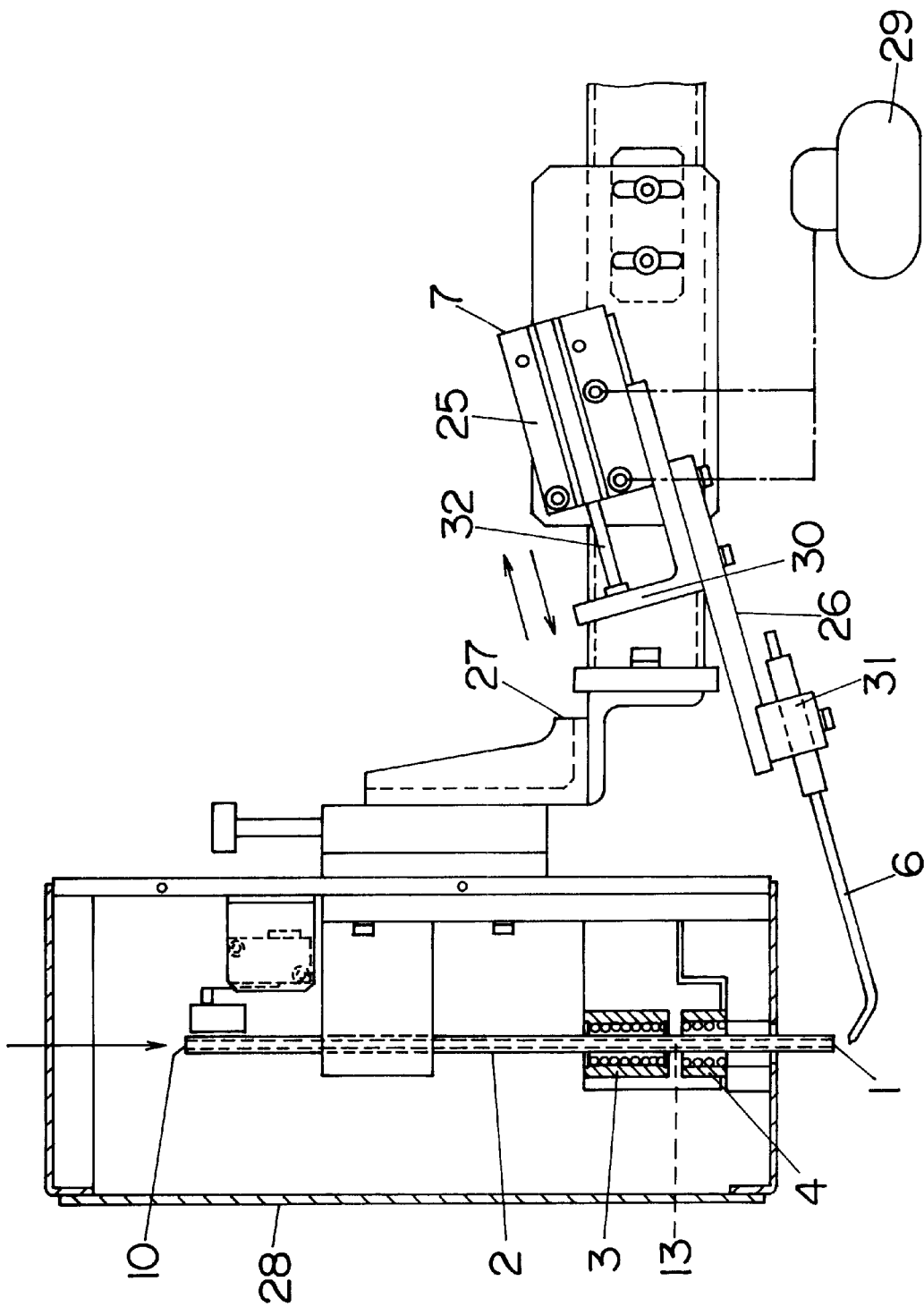
FIG. 2 is a schematic view of an electrode traveling unit of the plasma treatment apparatus.

A preferred embodiment of the plasma treatment apparatus of the present invention is shown in FIGS. 1 and 2. This apparatus comprises a cylindrical tube 2 of an insulation (dielectric) material used as a plasma-generation chamber, a pair of first and second electrodes 3, 4 each having a ring-like shape, power source 11 for applying an AC electric field between those electrodes, gas supply unit 8 for supplying a gas for plasma generation into the chamber, pulse generator 5 for providing a pulse voltage, ignition electrode 6 for applying the pulse voltage to the gas supplied in the chamber, and an electrode traveling unit 7 for the ignition electrode.

As the insulation material for the cylindrical tube 2, for example, it is possible to use glass-based or ceramic materials such as quarts, alumina, yttrium-partially-stabilized zirconia (Y-PSZ). The top opening of the cylindrical tube 2 is used as a gas inlet 10, through which the gas for plasma generation is supplied. The bottom opening of the cylindrical tube 2 functions as a plasma blowoff nozzle 1. It is preferred that an internal diameter of the bottom opening of the cylindrical tube 2 is within a range of 1 mm to 20 mm.

The first and second electrodes 3, 4 are disposed such that the cylindrical tube 2 passes through those electrodes having the ring-like shape and the first electrode 3 is spaced from the second electrode 4 by a required distance. It is preferred that the required distance is within a range of 3 to 20 mm to stably obtain plasma. In addition, each of the first and second electrodes 3, 4 makes contact with an outer surface of the cylindrical tube 2. An inside space of the cylindrical tube 2 between the first and second electrodes 3, 4 is referred to as a glow-discharge region 13. As the electrode material, for example, it is possible to use metal materials having electrical conductivity such as copper, aluminum, brass, and stainless steels. The first electrode 3 is connected to the power source 11 through an impedance matching device 12. The second electrode 4 is grounded.

Figure 3:
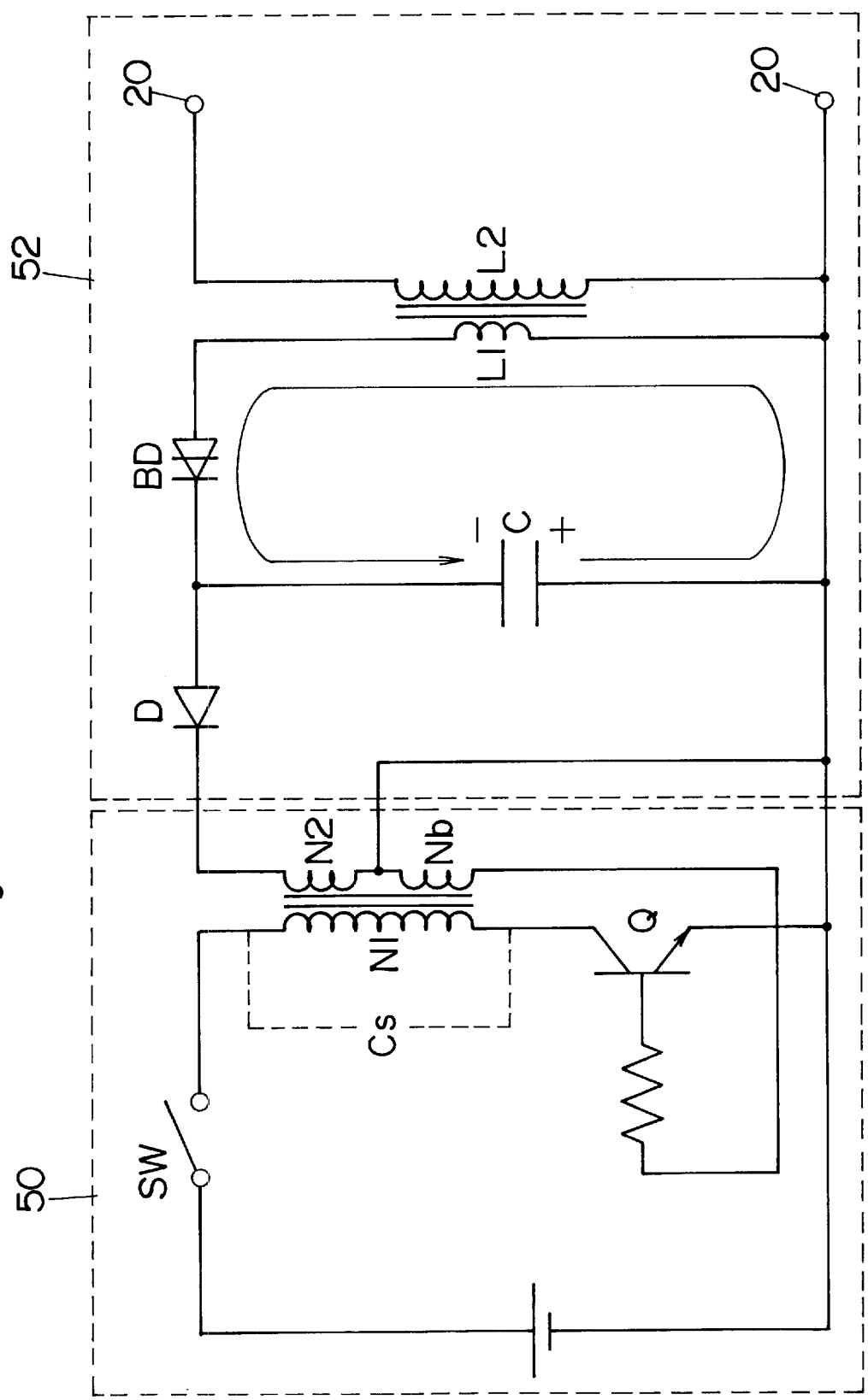
FIG. 3 is a schematic circuit view of a blocking oscillator used in the plasma treatment apparatus.

The pulse generator 5 can provide a pulse voltage of a high voltage. For example, the pulse generator 5 has a circuit shown in FIG. 3. This circuit is formed with an inverter portion 50 and a discharge portion 52. The inverter portion 50 is generally known as a blocking oscillator, which is a positive feedback circuit composed of a single transistor and a transformer to develop an extremely sharp pulse having a narrow pulse width. In FIG. 3, when a switch SW is turned on, a small current flows through the transistor Q, so that an induced voltage occurs in a base winding N1 of the transistor due to mutual inductance. This induced voltage has the polarity that biases the base of the transistor Q in the forward direction. As base current flows according to this induced voltage, collector current increases. Since the induced voltage for the base winding N1 is increased by the increase in collector current, the collector current further increases. However, when the increase in collector current is saturated due to a winding resistance and a saturation resistance of the transistor Q, the induced voltage for the base winding N1 starts to decrease. As the induced voltage for the base winding N1 decreases, the collector current also reduces. Therefore, the transistor Q is rapidly turned to the OFF position. Thereby, a large electromotive force occurs in the base winding N1, so that the distributed capacitance Cs of the base winding N1 is charged. As a result of the charging of the distributed capacitance, an oscillating voltage develops in the base winding N1. When a positive half period starts from the end of a negative half period, the base winding N1 is biased in the forward direction, so that current starts to flow through the collector again, and the transistor Q returns to an initial conductive state. By repeating the above operation, alternate current (AC) is output to windings (N2, Nb) disposed at the output side.

At the discharge portion 52, an electric power converted to AC by the inverter portion 50 is rectified by a diode D. By this current, a capacitor C is charged to the polarity shown in FIG. 3, so that a terminal voltage of the capacitor C raises. When charging is sufficiently performed, and the charging voltage reaches a breakdown voltage (100 V) of a breakdown device BD, the breakdown device is turned on, and a discharge loop is formed, as shown by the arrow in FIG. 3. At this time, a buildup of energy in the capacitor C is released as current. The released current flows through a primary transformer L1, so that a high voltage develops at the output terminal 20 of a secondary transformer L2.

The ignition electrode 6 is connected to the output terminal 20 of the pulse generator 5. The ignition electrode 6 is of a rod having a sharp-pointed end, which can be made of the same metal material as the first and second electrodes 3, 4.

The electrode traveling unit 7 is composed of a base 27, air compressor 29, air cylinder 25 fixed to the base, electrode holder 31 for catching the ignition electrode 6, movable part 30 connected to a rod 32 of the air cylinder and movably attached to the air cylinder 25, and a coupling member 26 for coupling between the electrode holder 31 and the movable part 30. The numeral 28 is a case for the cylindrical tube 2. By driving the air cylinder 25, it is possible to move the ignition electrode 6 held by the electrode holder 31 toward a downstream position under the bottom opening (blowoff nozzle) of the cylindrical tube 2. In other words, the ignition electrode 6 can be traveled between an ignition position, where the ignition electrode is disposed such that the sharp-pointed end of the ignition electrode is positioned outside of the cylindrical tube 2 and in the vicinity of an orifice of the blowoff nozzle, and a rest position where the ignition electrode is spaced from the blowoff nozzle, as shown by the arrows in FIG. 2.

The electrode traveling unit 7 may be omitted from the apparatus of FIG. 2. In this case, the ignition electrode 6 may be fixed such that the sharp-pointed end of the ignition electrode is positioned in the vicinity of the orifice of the blowoff nozzle 1.

By using the plasma treatment apparatus described above of the present invention, a plasma treatment can be performed to an object according to the following method. First, the gas for plasma generation is supplied to the interior of the cylindrical tube 2 through the gas inlet 10. An AC electric field of radio frequency provided from the power source 11 through an impedance matching device 12 is applied between the first and second electrodes 3, 4. It is preferred that the voltage value applied between the first and second electrodes is within a range of 0.5 to 1 kV to stably maintain plasma in the cylindrical tube 2 after the plasma is generated by help of the ignition electrode 6, as explained later.

Next, the pulse voltage provided from the pulse generator 5 is applied to the gas supplied in the cylindrical tube 2 by use of the ignition electrode 6. At this time, the ignition electrode 6 is positioned at the ignition position. It is preferred that a magnitude of the pulse voltage is three times or more of the voltage value applied between the first and second electrodes 3, 4. When the magnitude of the pulse voltage is less than three times of the voltage value therebetween, it may be difficult to generate the plasma under the atmospheric pressure with reliability within a short time period, e.g., 1 second or less. The upper limit of the magnitude of the pulse voltage is not limited. For example, it may be 40 times or less of the voltage value applied between the first and second electrodes 3, 4.

When the pulse voltage is applied, a preliminary discharge is first generated in the glow-discharge region in the cylindrical tube 2, and then the preliminary discharge is expanded by the voltage applied between the first and second electrodes 3, 4 to obtain the atmospheric pressure plasma. In other words, immediately when the preliminary discharge is generated in the cylindrical tube 2 by help of the ignition electrode 6, it is expanded and maintained in the glow-discharge region 13 by the AC electric field applied between the first and second electrodes 3, 4. To stably maintain the plasma, it is preferred that a frequency of the AC electric field applied between the first and second electrodes 3, 4 is within a range of 1 kHz to 200 MHz, and an electric power applied to the glow-discharge region is within a range of 20 to 3500 W/cm$^3$. The unit (W/cm$^3$) of the electric power means an electric-power value per unit volume of the glow-discharge region 13. The atmospheric pressure plasma is injected to the object placed under the cylindrical tube 2 through the blowoff nozzle 1. After the atmospheric pressure plasma is generated, the ignition electrode 6 is moved toward the rest position by the electrode traveling unit 7.

As the gas for plasma generation used in the above plasma treatment, it is possible to use an inert gas (rare gas), mixture of inert gases or a mixture of the inert gas and a reactive gas. As the inert gas, it is possible to use helium, argon, neon, or krypton. In views of discharge stability and cost efficiency, it is preferred to use helium, argon or a mixture of thereof. The reactive gas is optionally selected according to the purpose of the surface treatment. For example, in case of cleaning organic substances on objects to be treated, removing resists, or etching organic films, it is preferred to use an oxidative gas such as oxygen, air, $CO_2$ or $N_2O$. In addition, in case of etching silicon, it is effective to use a fluorine-based gas such as $CF_4$ as the reaction gas. When reducing metal oxides, it is possible to use a reducing gas such as hydrogen or ammonia. As an example, it is preferred that an additive amount of the reactive gas is within a range of 10 wt % or less, and more preferably 0.1 to 5 wt % with respect to the total amount of the inert gas. When the amount of the reactive gas is less than 0.1 wt %, the treatment effect may not be sufficiently obtained. On the other hand, when the amount of the reactive gas is more than 10 wt %, the discharge may become unstable.

Figure 4:
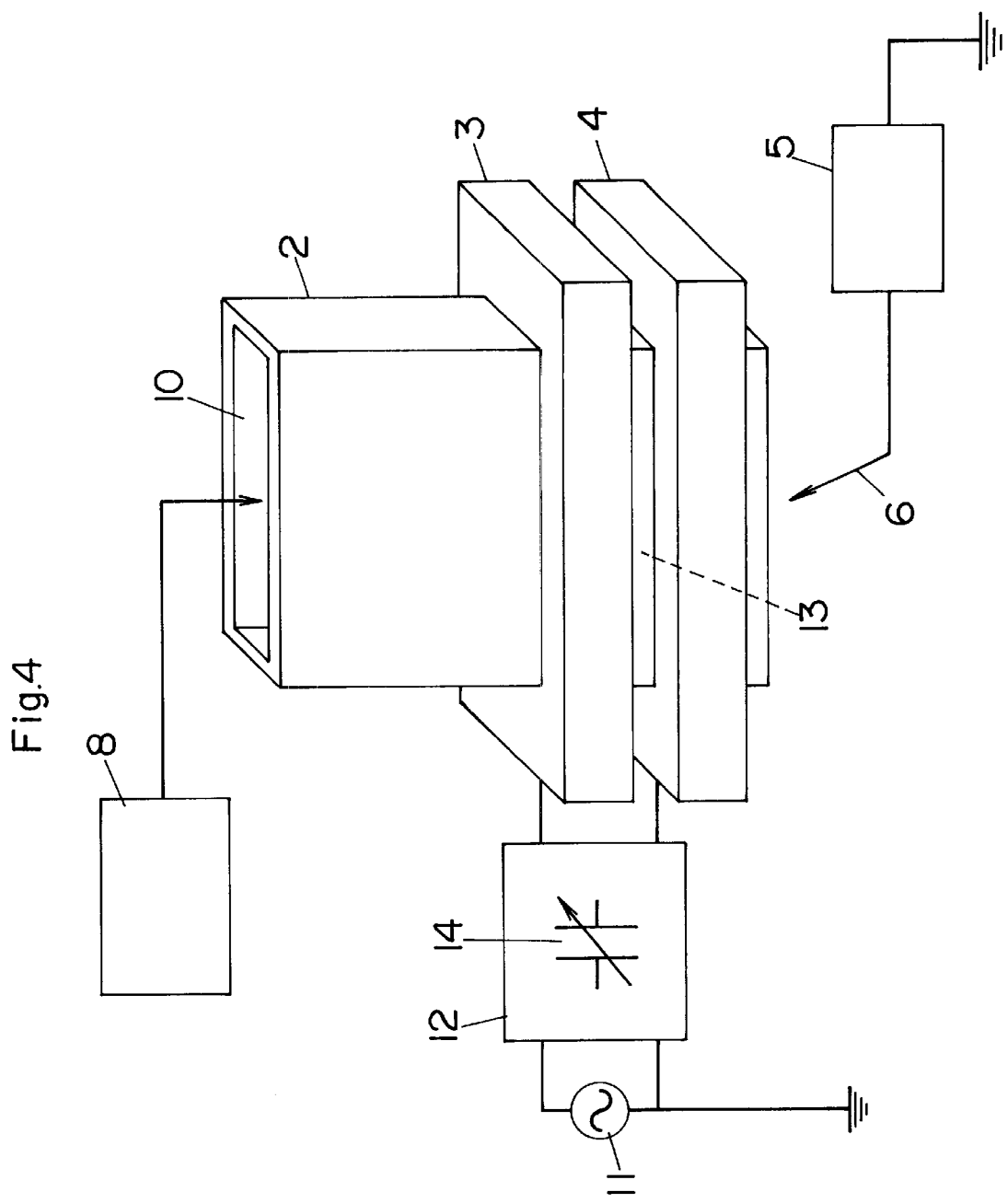
FIG. 4 is a schematic perspective view showing a modification of the plasma treatment apparatus.

As a modification of the plasma-generation chamber, a rectangular tube 2 having a slit-like nozzle (not shown) at its bottom opening may be used, as shown in FIG. 4. In this case, it is preferred that a width of the nozzle of the rectangular tube 2 is within a range of 1 mm to 20 mm to stably obtain plasma. Each of first and second electrodes 3, 4 has a rectangular ring-like shape, through which the rectangular tube 2 passes. Since this plasma treatment apparatus provides a curtain-like plasma from the nozzle, it is possible to further improve the efficiency of the plasma surface treatment. The other components are the same as the above apparatus.

Figure 5:
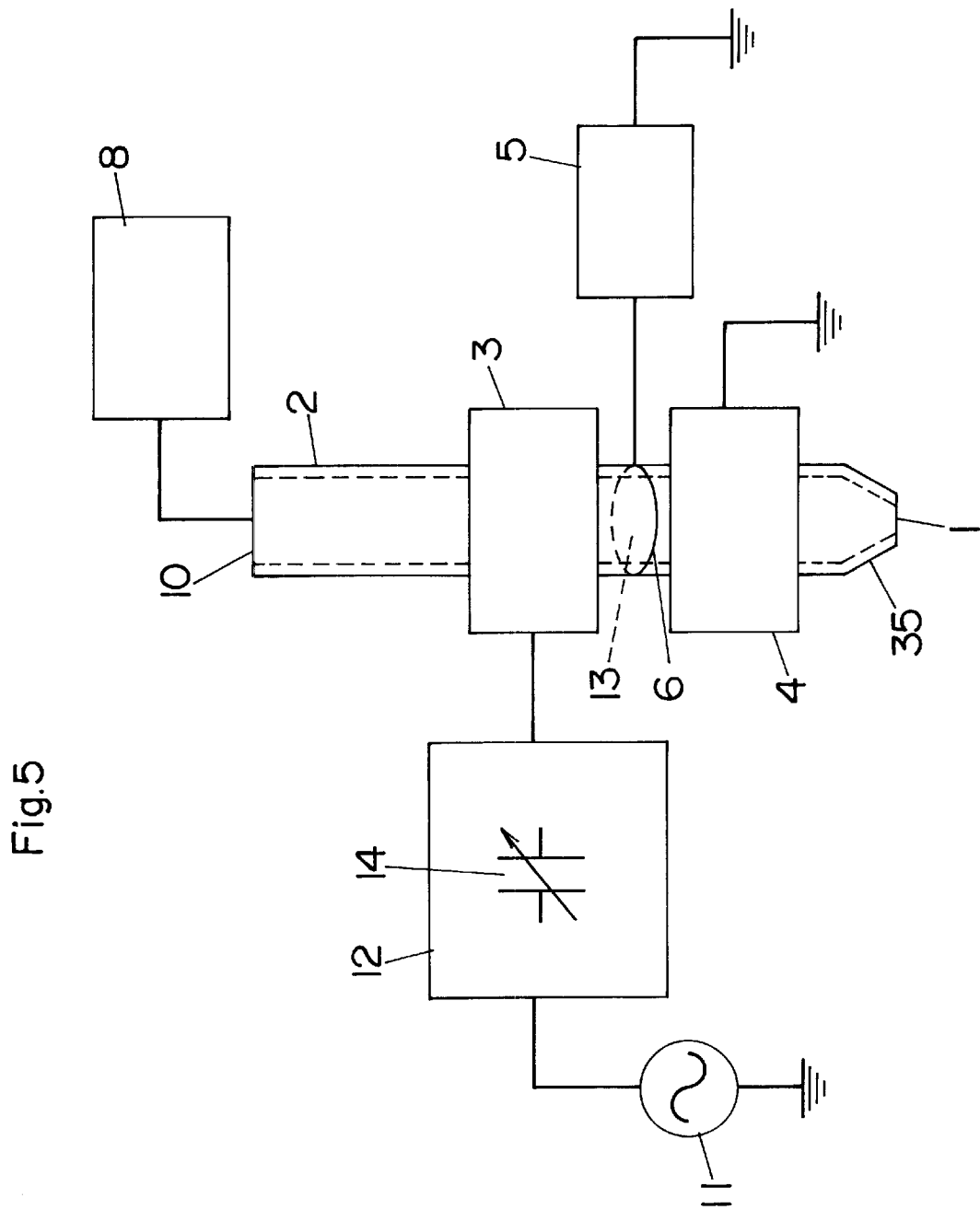
FIG. 5 is a schematic view of a plasma treatment apparatus according to a further preferred embodiment of the present invention.

A further preferred embodiment of the plasma treatment apparatus of the present invention is shown in FIG. 5, that is substantially the same as the apparatus of FIG. 1 except for the following features. That is, the cylindrical tube 2 has a tapered bottom end 35 that functions as a plasma blowoff nozzle 1 with a smaller orifice than the internal diameter of the cylindrical tube 2. This nozzle 1 is effective to accelerate the velocity of flow of a jet-like plasma injected therefrom. In this case, since the jet-like plasma can reach the object before short-lived radicals and activated particles of the reactive gas in the plasma disappear, it is possible to improve the efficiency of the plasma treatment.

In addition, this apparatus has a conductive wire wound around an outer surface of the cylindrical tube 2 between the first and second electrodes 3, 4, which is used as the ignition electrode 6. The conductive wire 6 is connected to the pulse generator 5. It is preferred that a magnitude of the pulse voltage applied to the wound conductive wire is 1.5 times of the pulse voltage applied in case of using the ignition electrode of the metal rod to provide atmospheric pressure plasma with reliability.

Figure 6A:
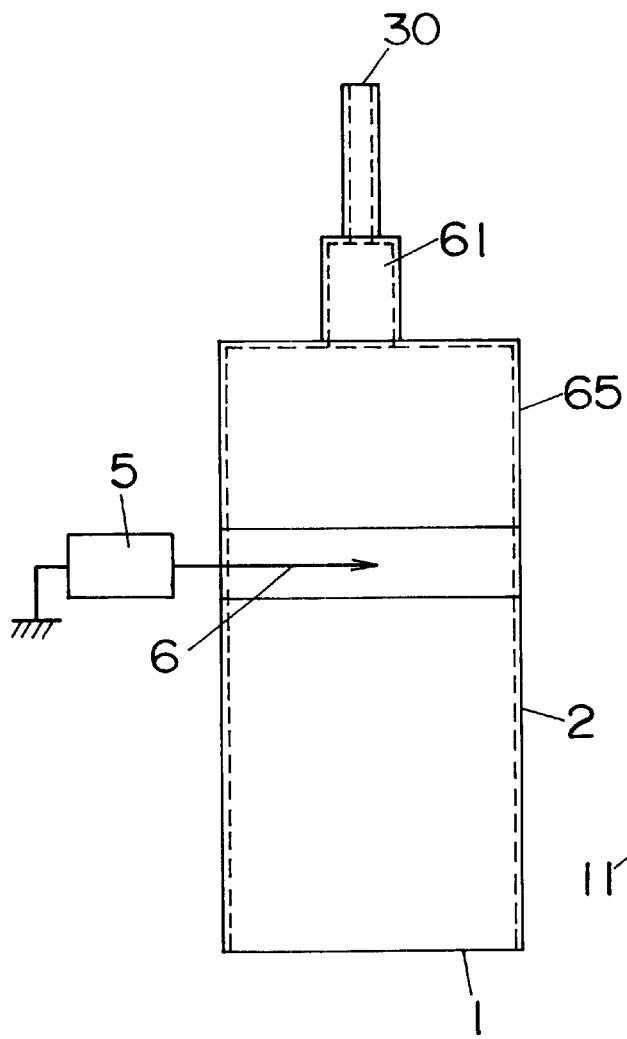
FIGS. 6A to 6C are schematic front, side and top views of a plasma treatment apparatus according to another preferred embodiment of the present invention.
Figure 6B:
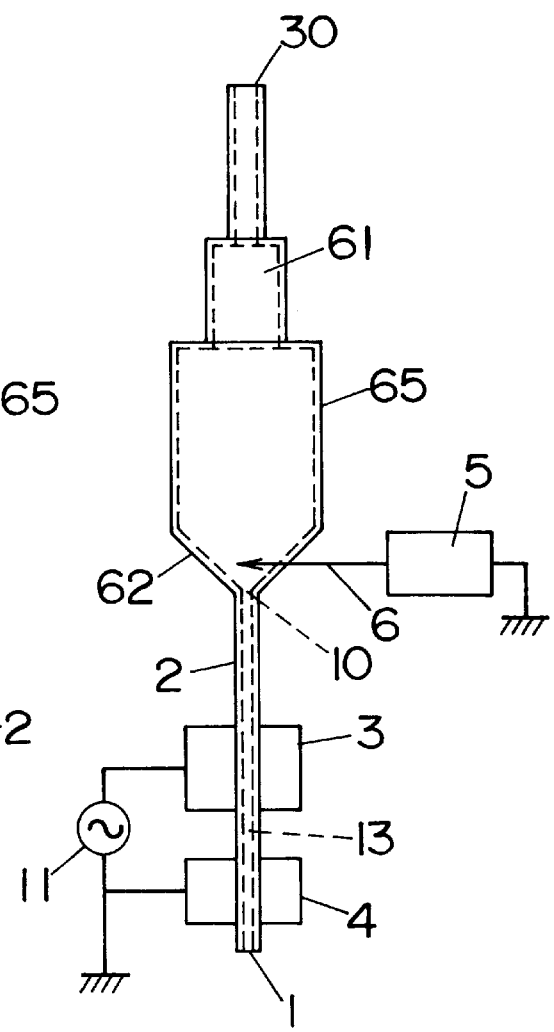
Figure 6C:
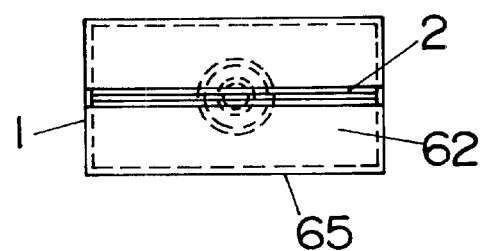

Another preferred embodiment of the plasma treatment apparatus of the present invention is shown in FIGS. 6A to 6C, that is substantially the same as the apparatus of FIG. 1. That is, a plasma generation chamber is formed with an upper cylindrical tube 61 having a gas inlet 30, gas introducing portion 65 having a rectangular-box shape, tapered portion 62 provided at the lower end of the gas introducing portion to focus the gas, and a thin cylindrical tube 2 extending to pass through first and second electrodes 3, 4 each having a ring-like shape.

The bottom opening of the thin cylindrical tube 2 functions as the plasma blowoff nozzle 1. It is preferred that an inside dimension of the bottom opening is within a range of 1 mm to 20 mm. When the bottom opening is of a circular shape, the inside dimension designates a diameter of the circle. When the bottom opening is of an ellipse shape, the inside dimension designates a short diameter of the ellipse. When the bottom opening is of a rectangular shape, the inside dimension designates a distance between opposite sides in a short-width direction of the rectangle. When the bottom opening is of a square shape, the inside dimension designates a distance between the opposite sides of the square.

The first and second electrodes 3, 4 make contact with the outer surface of the thin cylindrical tube 2. The numeral 13 designates a glow-discharge region defined in the thin cylindrical tube 2 between the first and second electrodes 3, 4. In this embodiment, an ignition electrode 6 is inserted in the tapered portion 62 of the plasma-generation chamber and disposed above the upper end 10 of the thin cylindrical tube 2. That is, the ignition electrode 6 is disposed upstream from the glow discharge portion 13. The first and second electrodes 3, 4 and the power source 11 are not shown in FIGS. 6A and 6C.

Modifications of the arrangement of the electrodes 3, 4 are shown in FIGS. 7A and 7B. In FIG. 7A, an outer electrode 40 is a ring-like electrode that is disposed to make contact with an outer surface of the cylindrical tube 2, and an inner electrode 41 is a rod-like electrode that is disposed in the interior of the cylindrical tube 2. The gas for plasma generation flows through a clearance between the inner surface of the cylindrical tube 2 and the inner electrode 41 toward the bottom opening of the cylindrical tube. An AC electric field provided from the power source 11 is applied between the outer and inner electrodes 40, 41 to obtain the plasma in the glow-discharge region 13. The obtained plasma blows out from a tapered nozzle 35.

In FIG. 7B, a pair of electrodes 3, 4 are disposed such that the electrode 3 is in a face-to-face relation with the electrode 4 through a reaction vessel for the plasma generation chamber. An AC electric field provided from the power source 11 is applied between the electrodes 3, 4 to obtain plasma in the glow-discharge region 13. The generated plasma blows out from a tapered nozzle 35.

According to the plasma treatment apparatus of the present invention, the atmospheric pressure plasma can be speedily generated with reliability when a pulse voltage is applied to the gas supplied in the cylindrical tube 2 by the ignition electrode 6, while a relatively small voltage is being applied between the first and second electrodes. The generated plasma is stably maintained by the small voltage applied between those electrodes. Thus, since it is not needed to apply a high voltage between the first and second electrodes, it is possible to facilitate starting the plasma treatment apparatus without causing arc discharge in a variable capacitor of the impedance matching unit.

In addition, since an expensive variable capacitor having a high withstand voltage such as vacuum capacitor is not needed in the impedance matching unit, it is possible to provide the plasma treatment apparatus having excellent cost performance. Moreover, when the apparatus has the electrode traveling unit, the ignition electrode can be removed from a treatment space between the blowoff nozzle and the object to be treated. Therefore, there is an advantage that the ignition electrode is out of the way of the plasma treatment.

EXAMPLES 1 TO 3

The followings are preferred examples of a plasma generation method using the plasma treatment apparatus of the present invention.

EXAMPLE 1

A plasma generation method was performed by use of the apparatus shown in FIG. 1. The cylindrical tube 2 is made of quartz having the outer diameter of 5 mm and the internal diameter of 3 mm. An AC voltage of 13.56 MHz provided from the power source 11 was applied to the first electrode 3, and the second electrode 4 was grounded. As the gas for plasma generation, 0.3 liter/min of helium, 1.5 liter/min of argon and 0.02 liter/min of oxygen were supplied into the cylindrical tube 2 through the gas inlet 10. To obtain atmospheric pressure plasma of the mixture gas with use of an electric power of 100 W, a pulse voltage of about 15 kV was applied to the mixture gas in the cylindrical tube 2 by use of the ignition electrode 6. In this case, an AC voltage of 1 kV or less was applied between the first and second electrodes to maintain the atmospheric pressure plasma.

Figure 8:
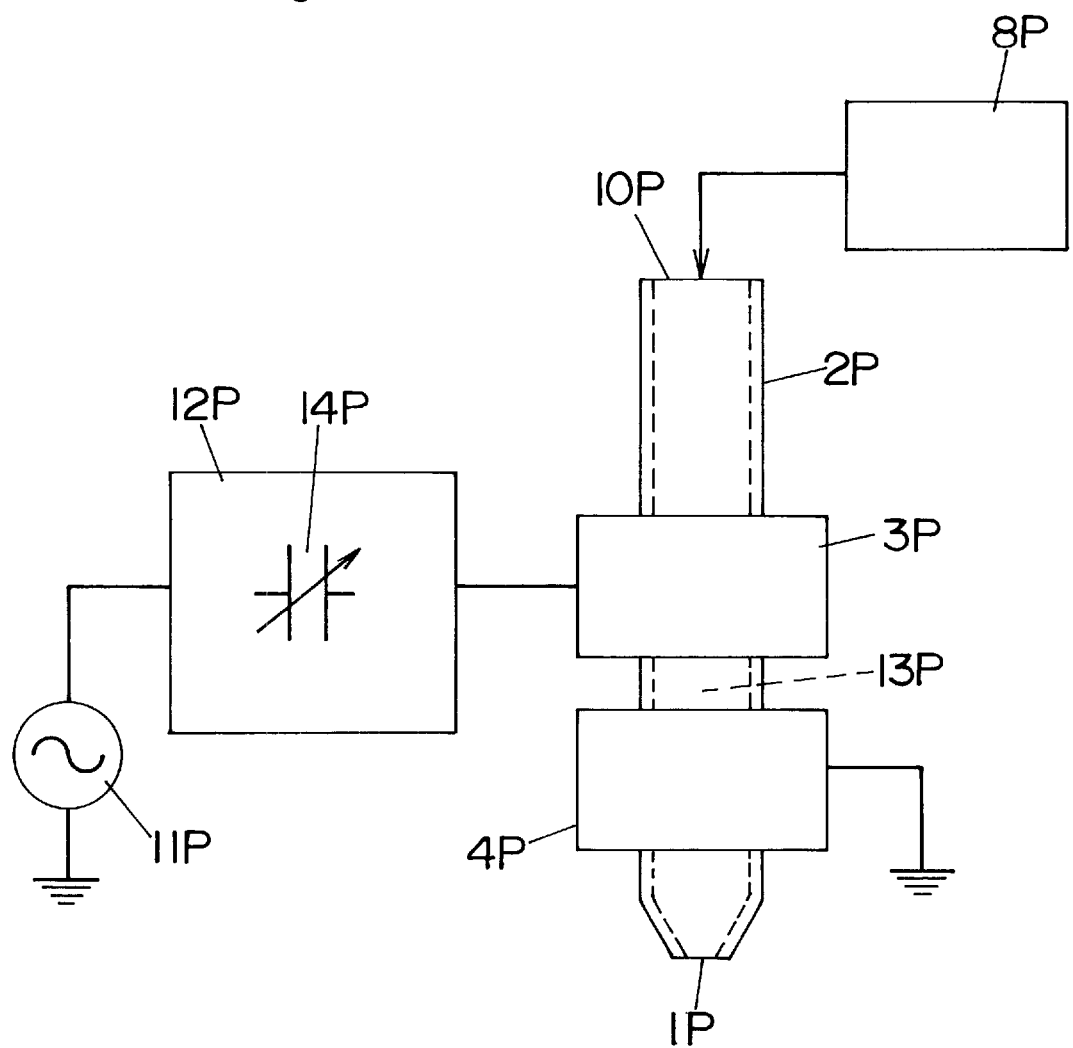
FIG. 8 is a schematic view of a plasma treatment apparatus according to the prior art.

On the contrary, in case of using the plasma treatment apparatus of the prior art shown in FIG. 8, it was needed to apply a high AC voltage of more than 5 kV between the first and second electrodes to generate the plasma. In addition, arc discharge often occurred in the variable capacitor of the impedance matching unit. Consequently, the atmospheric pressure plasma was hard to generate.

EXAMPLE 2

A plasma generation method was performed by use of the apparatus shown in FIG. 5. The cylindrical tube 2 is made of quartz having the outer diameter of 16 mm and the internal diameter of 13 mm. An AC voltage of 13.56 MHz provided from the power source 11 was applied to the first electrode 3, and the second electrode 4 was grounded. As the gas for plasma generation, 1 liter/min of helium, 3 liter/min of argon and 0.06 liter/min of oxygen were supplied into the cylindrical tube 2 through the gas inlet 10. To obtain atmospheric pressure plasma of the mixture gas with use of an electric power of 300 W, a pulse voltage of about 10 kV was applied to the mixture gas in the cylindrical tube 2 by use of the ignition electrode 6. In this case, an AC voltage of 1 kV or less was applied between the first and second electrodes to maintain the atmospheric pressure plasma.

On the contrary, in case of using the plasma treatment apparatus of the prior art shown in FIG. 8, it was needed to apply a high AC voltage of more than 2 kV between the first and second electrodes. In addition, arc discharge occasionally occurred in the variable capacitor of the impedance matching unit. Consequently, the atmospheric pressure plasma was hard to generate.

EXAMPLE 3

A plasma generation method was performed by use of the apparatus shown in FIG. 4. The rectangular tube 2 is made of quartz having the internal size of 55 mm×1 mm. An AC voltage of 13.56 MHz provided from the power source 11 was applied to the first electrode 3, and the second electrode 4 was grounded. As the gas for plasma generation, 2 liter/min of helium, 10 liter/min of argon and 0.4 liter/min of oxygen were supplied into the rectangular tube 2. To obtain atmospheric pressure plasma of the mixture gas with use of an electric power of 760 W, a pulse voltage of about 18 kV was applied to the mixture gas in the rectangular tube 2 by use of the ignition electrode 6. In this case, an AC voltage of 1 kV or less was applied between the first and second electrodes to maintain the atmospheric pressure plasma.

On the contrary, in case of using the plasma treatment apparatus of the prior art shown in FIG. 8, it was needed to apply a high AC voltage of more than 5 kV between the first and second electrodes 3, 4. In addition, arc discharge often occurred in the variable capacitor of the impedance matching unit. Consequently, the atmospheric pressure plasma was hard to generate.

The plasma treatment apparatus of the present invention can be used for removing foreign substances such as organic substances from objects to be treated, stripping resists, improving adhesion of organic films, surface modification, film formation, reducing metal oxides, or cleaning glass substrates for liquid crystal. In particular, the plasma treatment apparatus is useful to perform surface cleaning of electronic parts that precise connections are required.

What is claimed is:

1. A plasma treatment apparatus for treating an object with plasma generated under a pressure substantially equal to atmospheric pressure, said apparatus comprising:
    a plasma-generation chamber having an aperture from which said plasma blows out;
    a gas supply for supplying a gas for plasma generation into said chamber;
    a pair of electrodes;
    a power source for applying an AC electric field between said electrodes to maintain said plasma in said chamber;
    a pulse generator for providing a pulse voltage; and
    an ignition electrode for applying said pulse voltage to said gas supplied in said chamber to generate said plasma,
    wherein an inside dimension of said aperture is within a range of 1 mm to 20 mm.

2. The plasma treatment apparatus as set forth in claim 1, wherein said pair of electrodes make contact with an outer surface of said chamber.

3. The plasma treatment apparatus as set forth in claim 1, wherein said ignition electrode is disposed in the vicinity of said aperture.

4. The plasma treatment apparatus as set forth in claim 1, wherein said ignition electrode is disposed outside of said chamber and adjacent to a discharge region provided in said chamber by said pair of electrodes.

5. The plasma treatment apparatus as set forth in claim 1, wherein said ignition electrode makes contact with an outer surface of said chamber.

6. The plasma generation method set forth in claim 1, wherein a magnitude of said pulse voltage provided by said pulse generator is three times or more of a voltage value applied between said pair of electrodes.

7. A plasma treatment apparatus for treating an object with plasma generated under a pressure substantially equal to atmospheric pressure, said apparatus comprising:
    a plasma-generation chamber having an aperture from which said plasma blows out;
    a gas supply for supplying a gas for plasma generation into said chamber;
    a pair of electrodes;
    a power source for applying an AC electric field between said electrodes to maintain said plasma in said chamber;
    a pulse generator for providing a pulse voltage;
    an ignition electrode for applying said pulse voltage to said gas supplied in said chamber to generate said plasma; and
    an electrode traveling means for traveling said ignition electrode between a first position where said ignition electrode is disposed in the vicinity of said aperture to apply said pulse voltage to said gas and a second position where said ignition electrode is spaced from said aperture.

8. A plasma treatment apparatus for treating an object with plasma generated under a pressure substantially equal to atmospheric pressure, said apparatus comprising:
    a plasma-generation chamber having an aperture from which said plasma blows out;
    a gas supply for supplying a gas for plasma generation into said chamber;
    a pair of electrodes;
    a power source for applying an AC electric field between said electrodes to maintain said plasma in said chamber;
    a pulse generator for providing a pulse voltage; and
    an ignition electrode for applying said pulse voltage to said gas supplied in said chamber to generate said plasma,
    wherein a magnitude of said pulse voltage provided by said pulse generator is three times or more of a voltage value applied between said pair of electrodes.

9. A plasma generation method using a plasma treatment apparatus comprising:
    a plasma-generation chamber having an aperture from which said plasma blows out;
    a gas supply for supplying a gas for plasma generation into said chamber;
    a pair of electrodes;
    a power source for applying an AC electric field between said electrodes to maintain said plasma in said chamber;
    a pulse generator for providing a pulse voltage; and
    an ignition electrode for applying said pulse voltage to said gas supplied in said chamber to generate said plasma,
    wherein the plasma generation method comprises the step of applying a pulse voltage to a gas for plasma generation under a pressure substantially equal to atmospheric pressure by use of said ignition electrode to generate plasma in said chamber.

* * * * *